United States Patent
Hong

[11] Patent Number: 5,932,910
[45] Date of Patent: Aug. 3, 1999

[54] FLASH MEMORY CELL STRUCTURE HAVING ELECTRICALLY ISOLATED STACKED GATE

[75] Inventor: Gary Hong, Hsin-Chu, Taiwan

[73] Assignee: United Semiconductor Corp., Taiwan

[21] Appl. No.: 08/998,772

[22] Filed: Dec. 29, 1997

[30] Foreign Application Priority Data

Oct. 20, 1997 [TW] Taiwan .................................. 86115423

[51] Int. Cl.[6] .................................................. H01L 29/788
[52] U.S. Cl. ........................................... 257/321; 257/316
[58] Field of Search ................................. 257/316, 321; 438/264, 267

[56] References Cited

U.S. PATENT DOCUMENTS

| | | | |
|---|---|---|---|
| 4,823,175 | 4/1989 | Fontana | 257/321 |
| 5,151,761 | 9/1992 | Takebuchi | 257/321 |
| 5,378,910 | 1/1995 | Yoshikawa | 257/332 |
| 5,379,253 | 1/1995 | Bergemont | 257/321 |
| 5,434,813 | 7/1995 | Tamura et al. | 257/316 |
| 5,486,714 | 1/1996 | Hong | 257/321 |
| 5,516,713 | 5/1996 | Hsue et al. | 437/43 |
| 5,604,367 | 2/1997 | Yang | 257/321 |
| 5,637,897 | 6/1997 | Oyama | 257/321 |
| 5,640,032 | 6/1997 | Tomioka | 257/321 |
| 5,736,765 | 4/1998 | Oh et al. | 257/321 |
| 5,740,105 | 4/1998 | Gill | 257/321 |

*Primary Examiner*—David B. Hardy
*Attorney, Agent, or Firm*—Rabin & Champagne, P.C.

[57] ABSTRACT

This invention provides a flash memory cell structure comprising a semiconductor substrate; a tunneling oxide layer formed above the substrate and having a long narrow top profile; a gate oxide layer formed above the substrate on each side of the tunneling oxide layer; a bottom conductive layer formed above the substrate and surrounded the gate oxide layer; and a stacked gate formed above the tunneling oxide layer, the gate oxide layer and the bottom conductive layer, wherein there is an insulating layer between the stacked gate and the bottom conductive layer for electrically isolating the stacked gate from the bottom conductive layer, and that the stacked gate further comprises a floating gate, a dielectric layer and a control gate.

6 Claims, 7 Drawing Sheets

FLASH MEMORY CELL STRUCTURE HAVING ELECTRICALLY ISOLATED STACKED GATE

BACKGROUND OF THE INVENTION

1. Field of Invention

The present invention relates to a flash memory cell structure. More particularly, the present invention relates to an NAND-type flash memory cell structure that has a high coupling ratio and a low source/drain resistance. Additionally, when a programming or erasing operation is performed using the Fowler-Nordheim (F-N) tunneling effect, the operating voltage applied for proper working of the flash memory is lowered.

2. Description of Related Art

In general, the gate of a conventional flash memory has two layers, namely, a floating gate and a control gate. The floating gate layer fabricated from polysilicon material is used for the storage of electric charges. Normally, the floating gate is in a floating state because it does not have any direct connection with outside circuits. Above the floating gate is a control gate, which is used for controlling the storage and retrieval of data. Normally, the control gate is connected to a word line. The aforementioned floating gate and the control gate together constitutes a gate terminal structure, which is commonly referred to as a stacked gate. Since a flash memory can provide fast programming and erasing operations, it is a very popular type of erasable programmable read-only memory (EPROM). In general, the speed of a read or a write operation in a flash memory depends very much on the transferring speed of electrons from the floating gate to the source/drain terminal. For a flash memory structure having a high coupling ratio, the electric field necessary to initiate an F-N tunneling is small. In other words, the speed of transfer of electrons from the floating gate to the source/drain region is fast. Therefore, at present, the method to produce a flash memory structure that has a high coupling ratio is an important issue in semiconductor manufacture.

The conventional method of increasing coupling ratio in a flash memory includes increasing the overlapping area between the floating gate and the control gate, or decreasing the tunneling oxide area beneath the floating gate. However, according to the design rule, the flash memory must have a minimum size in the wafer in order for its layout to have the highest density. Under this condition, the overlapping area between the floating gate and the control gate above is limited, and therefore, a high coupling ratio is difficult to obtain. When the coupling ratio is low, a higher voltage must be supplied in order to operate the memory programming and erasing actions. For example, a voltage as high as 15V to 18V is needed. A high operating voltage makes any dimensional reduction of the flash memory very difficult. Besides, a thick gate oxide layer must be supplied to the peripheral MOS transistors to deal with the high voltage. For example, the thickness must be increased to about 200 Å to withstand the high voltage. This will increase the difficulties in implementing the design.

In light of the foregoing, there is a need in the art to provide an improved flash memory cell structure.

SUMMARY OF THE INVENTION

Accordingly, the present invention is directed to provide a flash memory cell structure and its method of manufacture. The method utilizes the reduction in tunneling oxide area beneath the floating gate not only to increase the coupling ratio, but also to lower the operating voltage required for programming and erasing operations.

To achieve these and other advantages and in accordance with the purpose of the invention, as embodied and broadly described herein, the invention provides a flash memory cell structure. The flash memory structure comprises a semiconductor substrate. Above the substrate, there is a tunneling oxide layer having a long and narrow top profile. There are gate oxide layers on two sides of the tunneling oxide layer. Surrounding the gate oxide layers is a bottom conductive layer. Between the gate oxide layer and the bottom conductive layer, there is a first insulating layer for electrically isolating the gate oxide layer and the bottom conductive layer. Above the tunneling oxide layer, the gate oxide layer and the bottom conductive layer, there is a stacked gate structure. Between the stacked gate structure and the bottom conductive layer, there is a second insulating layer for electrically isolating the stacked gate and the bottom conductive layer. Furthermore, the stacked gate comprises, from the bottom up, a floating gate, a dielectric layer and a control gate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 2A through 7A are cross-sectional views along line AA' in FIG. 1 showing the progression of manufacturing steps in the fabrication of an NAND-type flash memory cell according to one preferred embodiment of this invention; and FIGS. 2B through 7B are cross-sectional views along line BB' in FIG. 1 showing the progression of manufacturing steps in the fabrication of an NAND-type flash memory cell according to one preferred embodiment of this invention.

DESCRIPTION OF THE PREFERRED EMBODIMENTS

Figure 1:
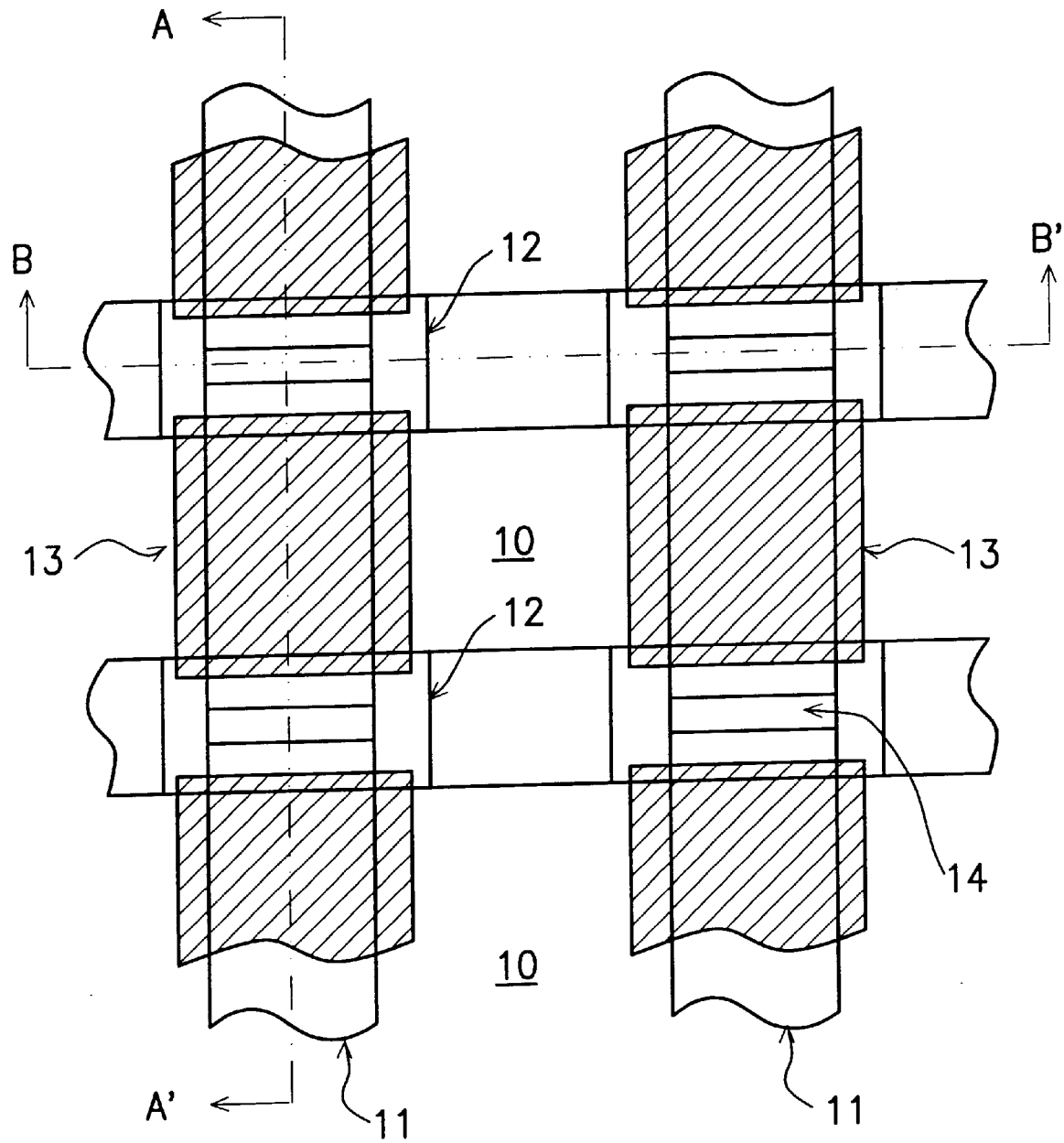
FIG. 1 is a top view showing an NAND-type flash memory cell structure according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

In a flash memory, the gate voltage that needs to be applied for programming and erasing operations is closely related to the coupling ratio. The higher the coupling ratio, the smaller will be the electric field necessary for F-N tunneling to occur. In other words, the higher the coupling ratio, the easier will be for the electrons to penetrate through the tunneling oxide layer, hence, the gate voltage necessary for the programming and the erasing operations is reduced.

This invention provides an improved type of flash memory cell design. The flash memory cell has NAND-type logic, and has a high coupling ratio. The characteristic of this invention is that the tunneling oxide surface area is rather small. Through the reduction in the tunneling oxide surface area, a high coupling ratio and a low source/drain resistance can be obtained. Therefore, the operating voltage necessary for bringing out F-N tunneling for programming or erasing operation is low, thereby improving the operational conditions of a conventional method.

FIG. 1 is a top view showing an NAND-type flash memory cell according to one preferred embodiment of this invention. First, as shown in FIG. 1, some insulation regions 10 are distributed over a substrate (not shown). The insulation regions, for example, can be a field oxide layer or a trench isolation structure for isolating and patterning active regions 11. The active regions 11 have a linear structure. Within the boundary of an active region 11 and its surrounding areas are structures including floating gates 12, bottom conductive layers 13 and tunneling oxide layers 14. The floating gate 12 and the bottom conductive layer are polysilicon layers. The tunneling oxide layer 14 is a thin oxide layer whose thickness can be varied but normally is about 70 Å. Control gates 15 (not shown), which have a long narrow top profile, are distributed above the floating gates 12. Each control gate 15 is made from a polysilicon layer, and is aligned in a direction perpendicular to the active regions 11. In general, a control gate functions as a word line. On each side of the control gate 15 in the substrate, ion-doped regions are also formed serving as source or drain regions. The surface area of the tunneling oxide layer is rather small, and the method to produce such an oxide structure is described in detail below with reference to FIGS. 2 through 7.

Figure 2A:
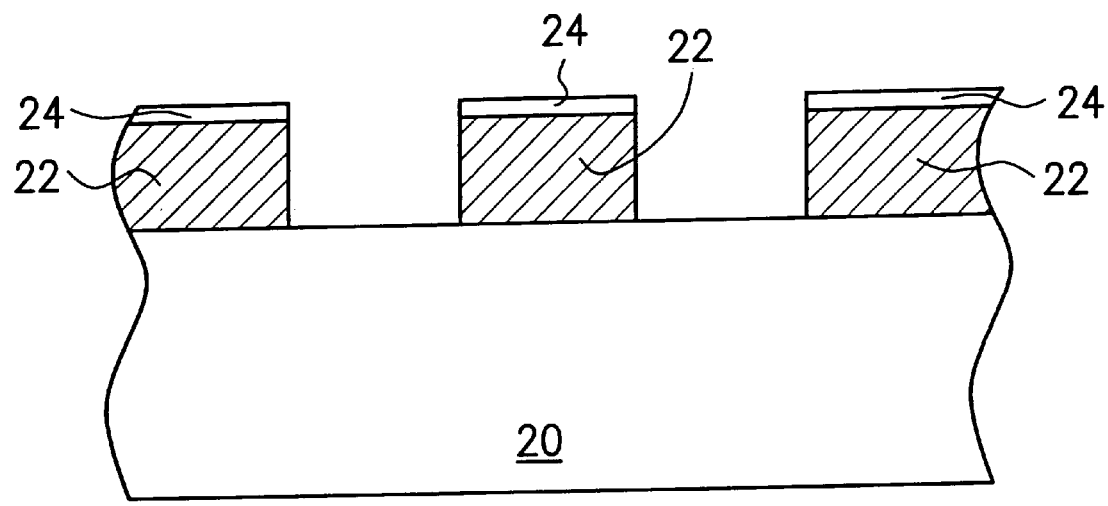
Figure 2B:
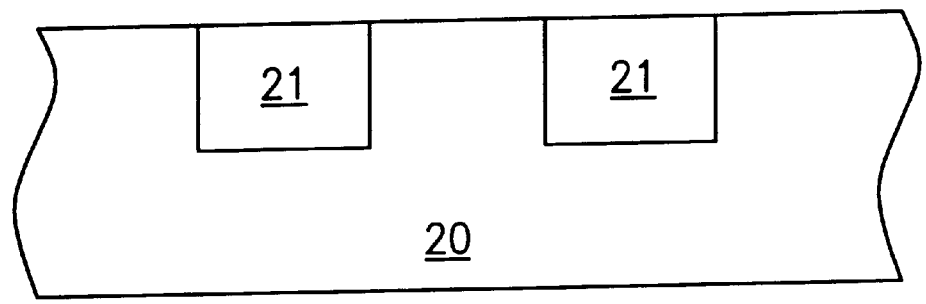

FIGS. 2A through 7A are cross-sectional views along line AA' in FIG. 1 showing the progression of manufacturing steps in the fabrication of an NAND-type flash memory cell according to one preferred embodiment of this invention. FIGS. 2B through 7B are cross-sectional views along line BB' in FIG. 1 showing the progression of manufacturing steps in the fabrication of an NAND-type flash memory cell according to one preferred embodiment of this invention. First, as shown in FIGS. 2A and 2B, a semiconductor substrate 20 is provided. Then, insulating regions 21 are formed over the substrate 20. The insulating regions 21 can be, for example, an oxide layer or a trench region having silicon dioxide material in it for isolating and patterning the boundary of the active region. Next, a bottom conductive layer 22 is formed in the active region of the substrate 20. The method for forming the bottom conductive layer 22 includes depositing polysilicon using a chemical vapor deposition (CVD) method. Thereafter, a cap oxide layer 24 is formed over the bottom conductive layer 22. The cap oxide layer can be formed, for example, by depositing silicon dioxide to a thickness of about 100 Å to 1000 Å using a chemical vapor deposition (CVD) method. In a subsequent step, an ion implantation is performed implanting arsenic (As) or phosphorus (P) ions into the bottom conductive layer 22. Photolithographic and etching processes are then used to pattern the bottom conductive layer 22 and the cap oxide layer 24, forming a structure as shown in FIG. 2A. The bottom conductive layer 22 is a means for forming a stacked gate having a sharp undulating three-dimensional profile in subsequent processes. This stacked gate structure is capable of reducing the overall device dimensions and able to provide a larger overlapping area between the floating gate and the control gate. Consequently, the coupling ratio of the device is increased.

Figure 3A:
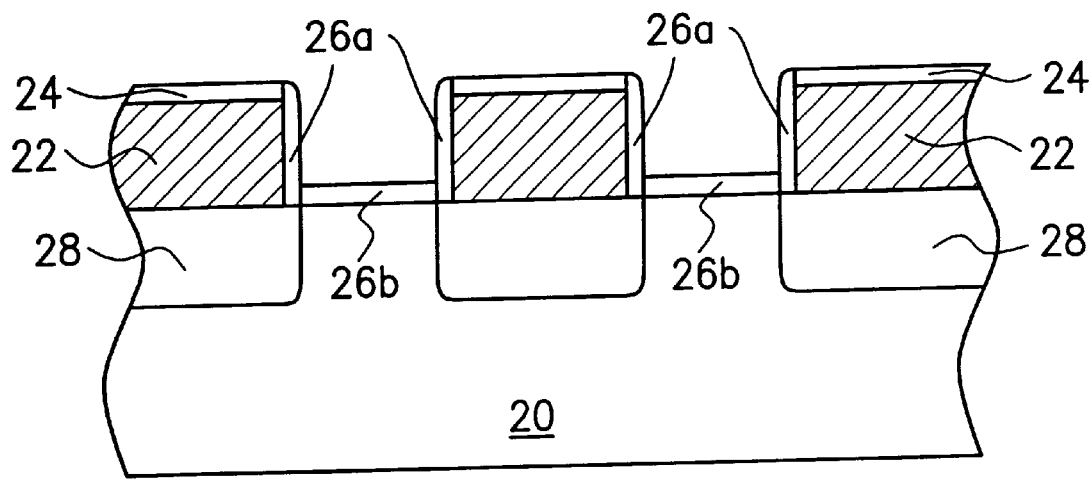
Figure 3B:
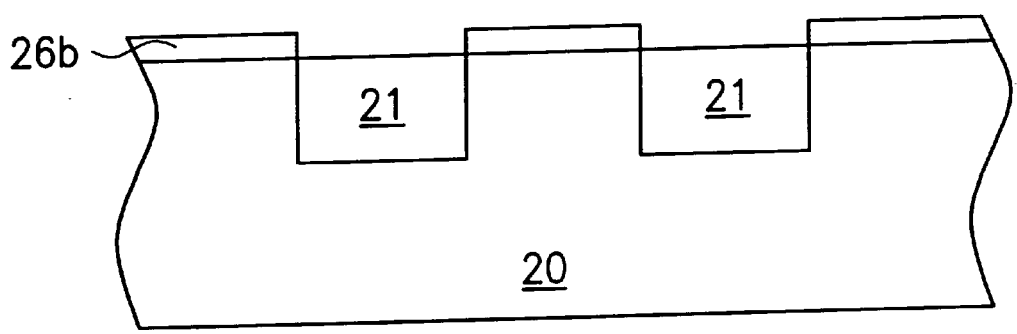

Next, as shown in FIGS. 3A and 3B, a thermal oxidation process is performed. At a high temperature and in an oxidizing atmosphere, oxygen will react with silicon in the silicon layer to form a silicon oxide layer 26a over the sidewalls of the bottom conductive layer 22 (because the bottom conductive layer 22 is a polysilicon layer). Similarly, silicon in the substrate will react with oxygen to form a gate oxide layer 26b, which has a thickness of about 100 Å to 400 Å, above the substrate 20 between the bottom conductive layer 22. At the same time, due to the oxidation reaction, the cap oxide layer 24 above the bottom conductive layer 22 will also be thickened. Thereafter, the substrate is heated to diffuse the implanted ions in the bottom conductive layer 22 forming ion-doped regions 28 in the substrate 20. These ion-doped regions later serve as source or drain regions.

Figure 4A:
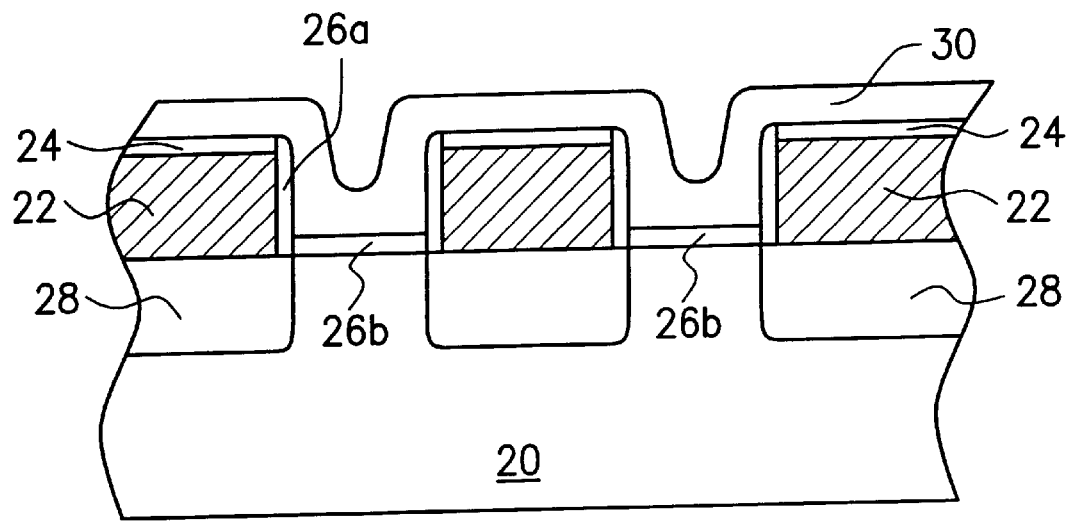
Figure 4B:
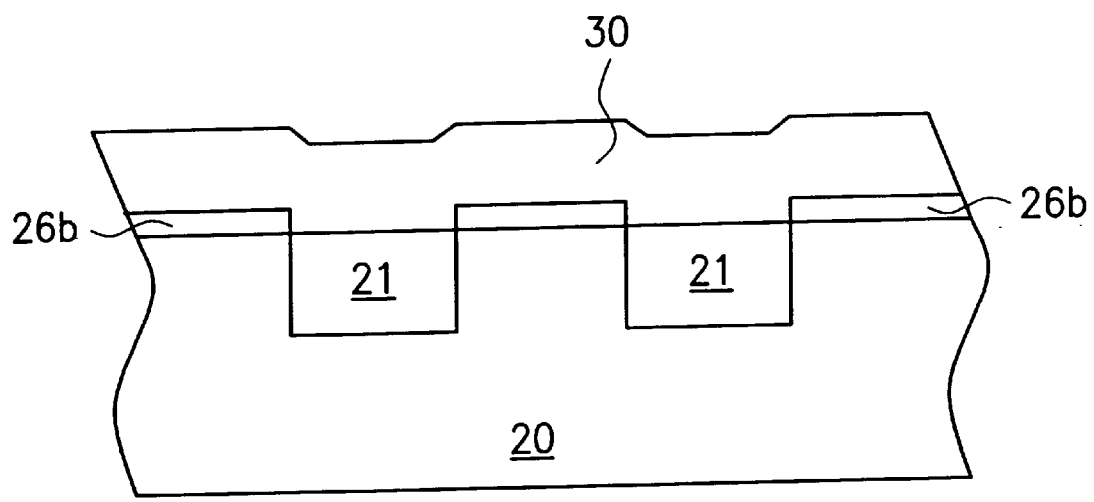

Next, as shown in FIGS. 4A and 4B, an insulating layer 30, for example, a silicon nitride layer, is formed over the cap oxide layer 24, the silicon oxide layer 26a and the gate oxide layer 26b. The silicon nitride layer can be deposited to a thickness of about 300 Å to 2000 Å, for example, using a chemical vapor deposition (CVD) method.

Figure 5A:
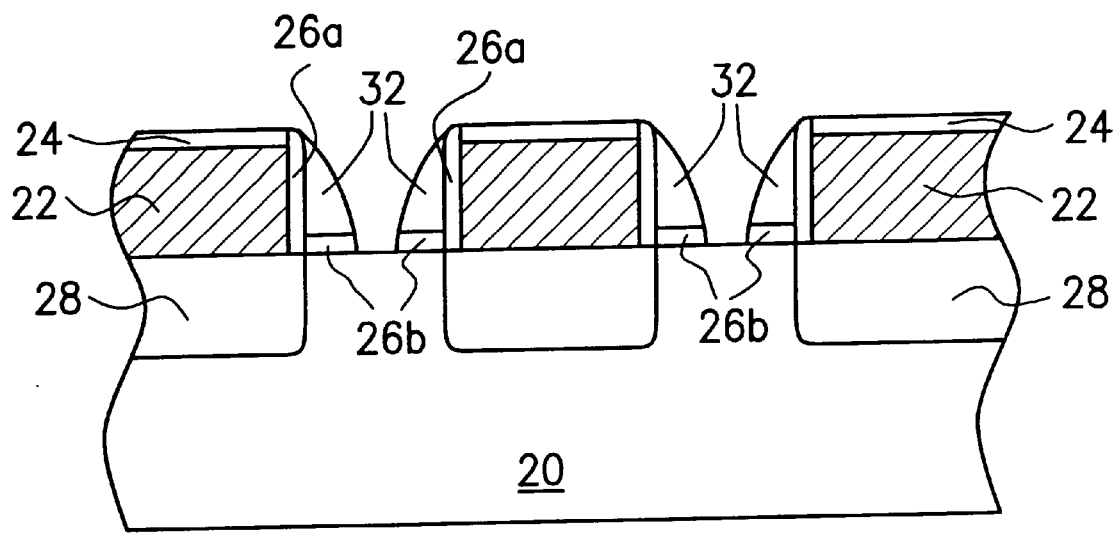
Figure 5B:
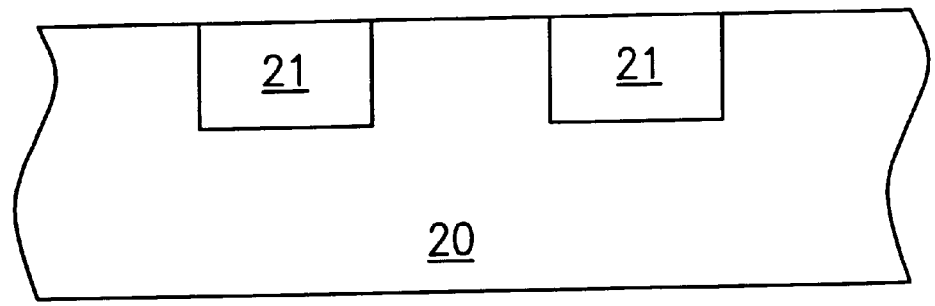

Next, as shown in FIGS. 5A and 5B, the insulating layer 30 is etched to form spacer structures adjacent to the silicon oxide layer 26a. The etching operation can be carried out using an anisotropic etching method. Subsequently, using the spacer structures 32 as masks, a portion of the gate oxide layer 26b is etched to expose the substrate 20 below as shown in FIG. 5A.

Figure 6A:
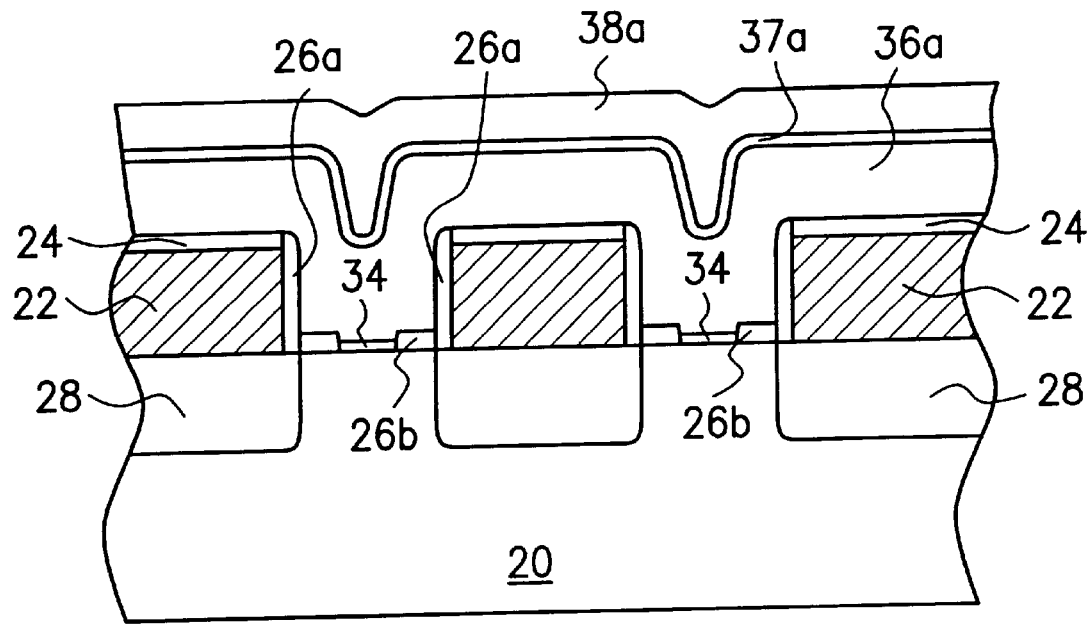
Figure 6B:
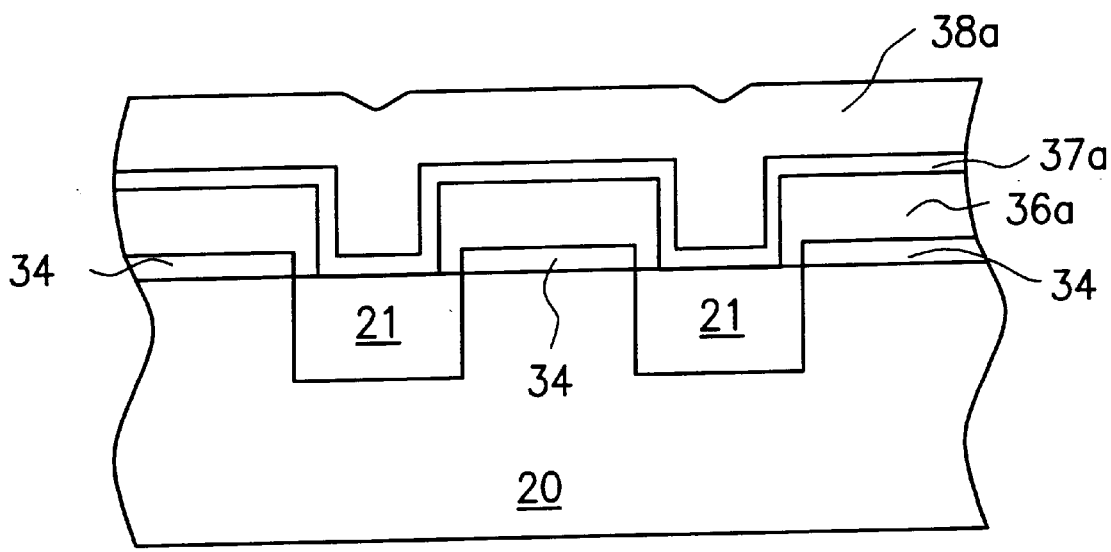

Next, as shown in FIGS. 6A and 6B, the spacer structures 32 are etched away to expose the gate oxide layer 26b, for example, using an isotropic wet etching method. Thereafter, a thermal oxidation process is carried out to form a tunneling oxide layer 34 in the narrow region between the gate oxide layer 26b. Since oxygen will react with silicon at a high temperature, silicon in the substrate between the gate oxide layer 26b will similarly reacts with oxygen to generate the tunneling oxide layer 34 above the substrate 20. Thickness of the tunneling oxide layer 34 is preferably controlled to within the range of 50 Å to 100 Å. The tunneling oxide layer 34 has a long narrow top profile, and is one of the main characteristics of this invention. Due to the oxidizing reaction during thermal oxidation, the gate oxide layer 26b will also be thickened somewhat. Next, a first conductive layer 36a is formed over the cap oxide layer 24, the silicon oxide layer 26a, the gate oxide layer 26b and the tunneling oxide layer 34. The first conductive layer 36a can be formed, for example, by depositing a polysilicon layer followed by doping ions into the polysilicon layer to increase its conductivity. Thereafter, a thin dielectric layer 37a, for example, having an oxide/nitride/oxide (ONO) composite structure, is formed over the first conductive layer 36a. Next, a second conductive layer 38a is formed over the dielectric layer 37a. The second conductive layer 37a can be formed, for example, by depositing a polysilicon layer followed by doping ions into the polysilicon layer to increase its conductivity.

Figure 7A:
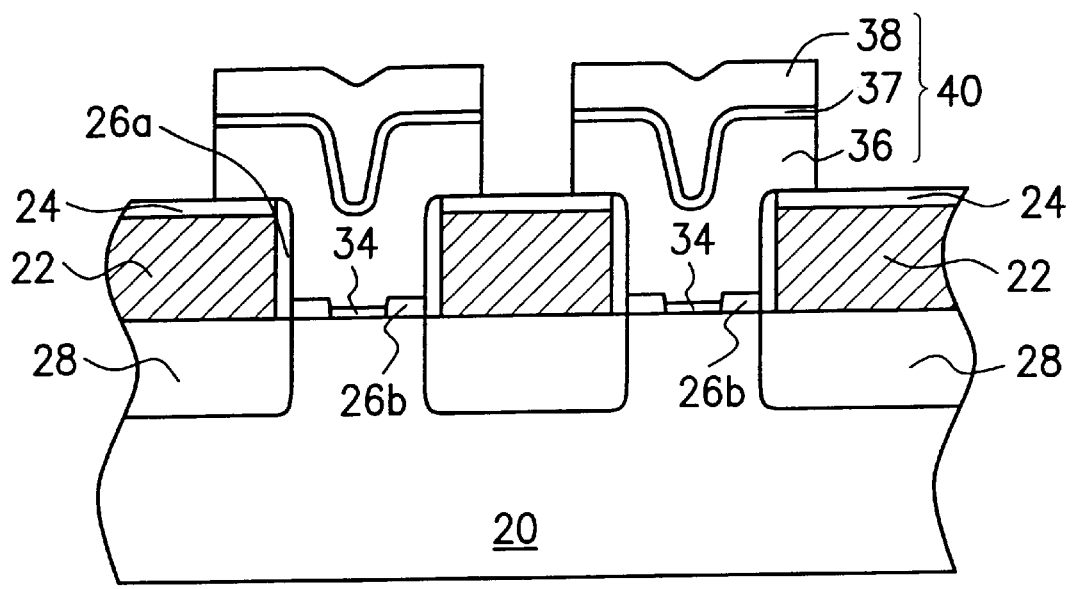
Figure 7B:
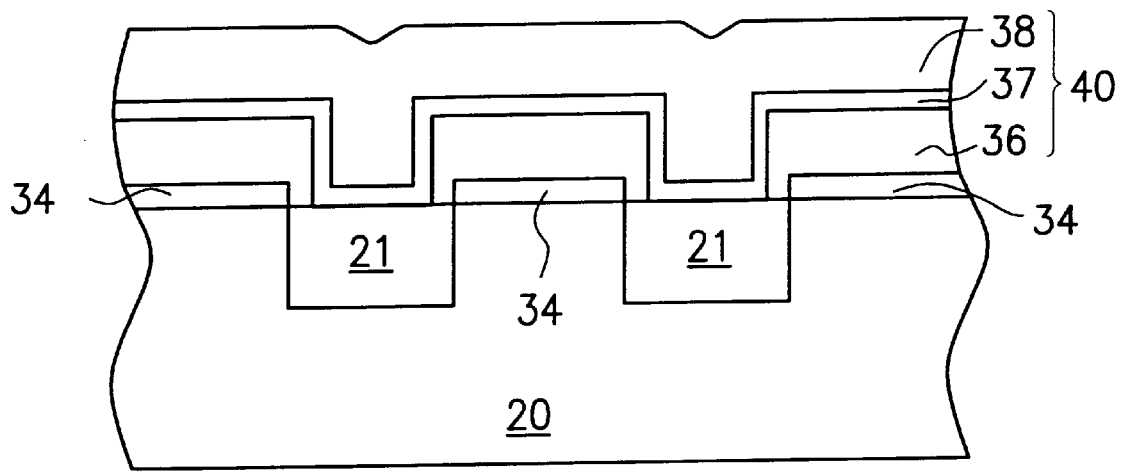

Next, as shown in FIGS. 7A and 7B, photolithographic and etching processes are performed. The second conductive layer 38a, the dielectric layer 37a and the first conductive layer 36a are etched sequentially to form a pattern of stacked gates 40. Each stacked gate 40 comprises a floating gate 36, a dielectric layer 37 and a control gate 38. Thus, the formation of the flash memory structure is complete.

As a summary, the flash memory cell structure and method of manufacture of this invention has several advantages, including:

1. The bottom conductive gate layer 22 is able to provide the stacked gate 40 a sharp undulating three-dimensional profile. Therefore, dimensions of the flash memory device can be reduced and the overlapping area between the floating gate and the control gate can be increased, thereby increasing the coupling ratio.

2. The tunneling oxide layer 34 has a long narrow top profile, hence able to reduce the area occupied by the tunneling oxide considerably. Consequently, the coupling ratio of the flash memory can be greatly increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash memory cell structure, comprising:

a semiconductor substrate;

a tunneling oxide layer formed above the substrate and having a long narrow top profile;

a gate oxide layer formed above the substrate on each side of the tunneling oxide layer, wherein the gate oxide layer has a thickness of about 100 Å to 400 Å;

a bottom conductive layer formed above the substrate and surrounding the gate oxide layer;

a stacked gate formed above the tunneling oxide layer, the gate oxide layer, and the bottom conductive layer, wherein the stacked gate comprises a floating gate, a dielectric layer, and a control gate; and an insulating layer between the stacked gate and the bottom conductive layer for electrically isolating the stacked gate from the bottom conductive layer.

2. The structure of claim 1, wherein the tunneling oxide layer has a thickness of about 100 Å to 400 Å.

3. The structure of claim 1, wherein the insulating layer has a thickness of about 100 Å to 1000 Å.

4. The structure of claim 1, wherein the dielectric layer is an oxide/nitride/oxide (ONO) composite layer.

5. A flash memory cell structure, comprising:

a semiconductor substrate;

a tunneling oxide layer formed above the substrate and having a long, narrow top profile;

a gate oxide layer formed above the substrate on each side of the tunneling oxide layer;

a bottom conductive layer formed above the substrate and surrounding the gate oxide layer;

an ion-doped region formed on the substrate and abutting below the bottom conductive layer;

a stacked gate formed above the tunneling oxide layer, the gate oxide layer, and the bottom conductive layer, and including a floating gate, a dielectric layer, and a control gate; and an insulating layer disposed between the stacked gate and the bottom conductive layer and covering the bottom conductive layer, for electrically isolating the stacked gate from the bottom conductive layer.

6. A flash memory cell structure comprising:

a semiconductor substrate;

a tunneling oxide layer formed above the substrate;

a gate oxide layer formed above the substrate on each side of the tunneling oxide layer;

a bottom conductive layer formed above the substrate and surrounding the gate oxide layer;

an ion-doped region formed on the substrate and completely abutting below the bottom conductive layer;

a stacked gate formed above the tunneling oxide layer, the gate oxide layer, and the bottom conductive layer, such that the gate oxide layer is completely covered by the stacked gate, and including a floating gate, a dielectric layer, and a control gate; and an insulating layer disposed between the stacked gate and the bottom conductive layer and covering the bottom conductive layer, for electrically isolating the stacked gate from the bottom conductive layer.

* * * * *